(12) United States Patent
Tominaga et al.

(10) Patent No.: US 7,789,707 B2
(45) Date of Patent: Sep. 7, 2010

(54) CONDUCTIVE CONTACT UNIT

(75) Inventors: Jun Tominaga, Kanagawa (JP); Koji Ishikawa, Kanagawa (JP); Taiichi Rikimaru, Kanagawa (JP)

(73) Assignee: NHK Spring Co., Ltd., Yokohama-shi, Kanagawa (JP)

( * ) Notice: Subject to any disclaimer, the term of this patent is extended or adjusted under 35 U.S.C. 154(b) by 0 days.

(21) Appl. No.: 12/224,447

(22) PCT Filed: Mar. 1, 2007

(86) PCT No.: PCT/JP2007/053951

§ 371 (c)(1),
(2), (4) Date: Aug. 27, 2008

(87) PCT Pub. No.: WO2007/102401

PCT Pub. Date: Sep. 13, 2007

(65) Prior Publication Data

US 2009/0233493 A1   Sep. 17, 2009

(30) Foreign Application Priority Data

Mar. 3, 2006 (JP) ............................. 2006-058644

(51) Int. Cl.
    *H01R 9/03* (2006.01)
(52) U.S. Cl. ............................................. 439/607.45
(58) Field of Classification Search ............ 439/607.45, 439/733.1; 200/61.45 R
    See application file for complete search history.

(56) References Cited

U.S. PATENT DOCUMENTS

| 2,877,319 | A | * | 3/1959 | Guncelle et al. | ............... 335/92 |
| 3,453,405 | A | * | 7/1969 | Gasik | .................. 200/61.45 R |
| 3,572,097 | A | * | 3/1971 | Kleesattel | ..................... 73/573 |
| 5,990,697 | A |  | 11/1999 | Kazama |  |
| 2005/0236931 | A1 | * | 10/2005 | Sakano et al. | .......... 310/323.17 |

FOREIGN PATENT DOCUMENTS

| JP | 08-075786 | 3/1996 |
| JP | 10-019930 | 1/1998 |
| JP | 10-132853 | 5/1998 |
| JP | 11-133060 | 5/1999 |
| JP | 2000-046870 | 2/2000 |
| JP | 2001-324515 | 11/2001 |
| JP | 2001-343397 | 12/2001 |
| JP | 2002-257893 | 9/2002 |

OTHER PUBLICATIONS

International Search Report mailed May 15, 2007, issued on PCT/JP2007/053951.

* cited by examiner

*Primary Examiner*—Jean F Duverne
(74) *Attorney, Agent, or Firm*—Edwards Angell Palmer & Dodge LLP

(57) ABSTRACT

A conductive contact unit establishes an electrical connection between different circuitries, and includes a plurality of conductive contacts that receive and output an electrical signal from and to the circuitries, respectively. The conductive contact unit includes a conductive contact holder that accommodates and holds the conductive contacts, and a vibration applying unit that applies vibration to the conductive contact holder.

6 Claims, 9 Drawing Sheets

CONDUCTIVE CONTACT UNIT

CROSS REFERENCE TO RELATED APPLICATIONS

This application is related to co-pending application: "CONDUCTIVE CONTACT UNIT" filed even date herewith in the names of Jun TOMINAGA, Koji ISHIKAWA and Taiichi RIKIMARU as a national phase entry of PCT/JP2007/053950; which application is assigned to the assignee of the present application and it is incorporated by reference herein.

TECHNICAL FIELD

The present invention relates to a conductive contact unit that is brought into contact with an electrode or a terminal of an electronic component and transmits and receives an electrical signal upon testing the conducting state and operating characteristics of the electronic component such as a liquid crystal panel or a semiconductor integrated circuit.

BACKGROUND ART

In a technological field of electrical characteristic testing of a test object such as a semiconductor integrated circuit, there is a known technology related to a conductive contact unit. The conductive contact unit includes a plurality of conductive contacts (probes), each of which is arranged correspondingly to a connecting terminal of the semiconductor integrated circuit, and provides electrical conductivity by bringing the conductive contacts into physical contact with the connecting terminals. A structure of the conductive contact includes at least the conductive contacts and a conductive contact holder for holding the conductive contacts. Along with a trend to miniaturize the semiconductor integrated circuit that is a test object, various technologies have been provided for the conductive contact unit to narrow the intervals between the arranged conductive contacts so that smaller intervals of connecting terminal arrangement can be accommodated.

As one of the examples of the conductive contacts that achieve narrower arrangement intervals, there has been provided a plate-shaped conductive member structure that is integrated with a contacting element that is brought into contact with the test object, and an resilient element that urges a snapping force to the contacting element. By arranging the plate-like conductive contacts in a through-thickness direction, it becomes theoretically possible, according to this technology, to arrange a number of conductive contacts in a small space. In this manner, a conductive contact that can support the narrower arrangement intervals of the connecting terminals of the test object can be achieved. (For example, see Patent Document 1 listed below.)

[Patent Document 1] Japanese Patent Application Laid-open Number 2001-343397

[Patent Document 2] Japanese Patent Application Laid-open Number H10-132853

DISCLOSURE OF INVENTION

Problem to be Solved by the Invention

In a conductive contact unit arranged such that a conductive contact holder includes guides and conductive contacts are inserted between the guides, a clearance is present between each conductive contact and each guide. Thus, when the conductive contact is being in contact with the guide and generates a load, a contact position of each of the conductive contacts and the guides varies, causing variation in frictional force. This leads to a possibility that a stable test signal cannot be supplied to a test object.

The present invention has been achieved to solve the above problems in the conventional technology and it is an object of the present invention to provide a conductive contact unit capable of reducing variation in frictional force generated between conductive contacts and the guides, and stably supplying a test signal.

Means for Solving Problem

According to an aspect of the present invention, a conductive contact unit may establish an electrical connection between different circuitries, and include a plurality of conductive contacts that receive and output an electrical signal from and to the circuitries, respectively. The conductive contact unit may include a conductive contact holder that accommodates and holds the conductive contacts, and a vibration applying unit that applies vibration to the conductive contact holder.

In the conductive contact unit according to the present invention, the vibration applying unit may include a vibrator attached to a side surface of the conductive contact holder.

In the conductive contact unit, the vibration applying unit may apply vibration with a resonance frequency of the conductive contact holder or vibration with a resonance frequency of the conductive contacts to the conductive contact holder.

In the conductive contact unit, the vibration applying unit may include a vibrator attached to a side surface of the conductive contact holder.

In the conductive contact unit, each of the conductive contacts may have a plate-like shape, and include a first contacting element that is brought into physical contact with one of the different circuitries; a second contacting element that is brought into physical contact with one of the different circuitries other than the one the first contacting element is brought into contact with; a resilient element that is interposed between the first contacting element and the second contacting element, and is expandable and contractible in a longitudinal direction; a first connecting element that connects the resilient element and the first contacting element; and a second connecting element that connects the resilient element and the second contacting element.

In the conductive contact unit, at least a portion of the second contacting element may project from an external surface of the conductive contact holder, inside which guiding grooves are formed, in a normal direction of the external surface.

In the conductive contact unit, the conductive contact holder may include a plurality of first guiding grooves each slidably engaging one edge in a width direction of one of the conductive contacts to hold the conductive contact; and a plurality of second guiding grooves each located opposite to corresponding one of the first guiding grooves, and slidably engaging another edge of the conductive contact than the one the corresponding first guiding groove engages to hold the conductive contact.

In the conductive contact unit, each of the conductive contacts may include a first needle-shaped member that is brought into physical contact with one of the different circuitries; a second needle-shaped member that is brought into physical contact with one of the different circuitries other than the one the first needle-shaped member is brought into contact with; and a spring member that is expandable and contractible in a longitudinal direction and couples the first needle-shaped member and the second needle-shaped member.

EFFECT OF THE INVENTION

According to an aspect of the present invention, it is possible to reduce variation in frictional force generated between the conductive contacts and the guides, and stably supply a test signal.

BRIEF DESCRIPTION OF DRAWINGS

FIG. 7-1 is a diagram of the conductive contact unit according to the first embodiment immediately after being brought into contact with a test object.

FIG. 7-2 is a diagram of the conductive contact unit according to the first embodiment with the test object elevated to a test position.

Figure 1:
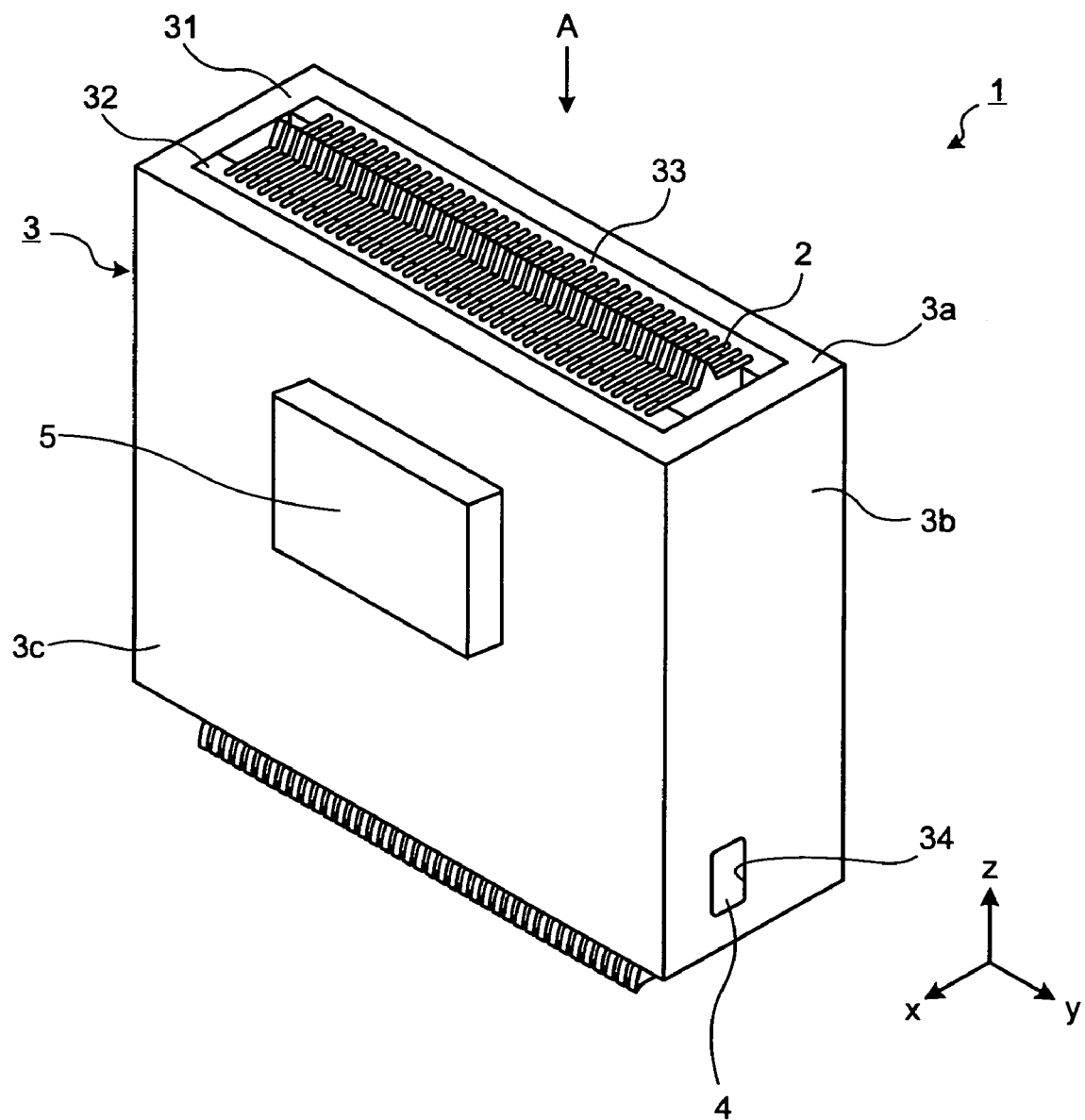
FIG. 1 is a perspective view of a structure of a conductive contact unit according to a first embodiment of the present invention.

EXPLANATIONS OF LETTERS OR NUMERALS 1, 7 conductive contact unit
2, 8 conductive contact
3, 9 conductive contact holder
3a upper wall
3b, 3c side wall
3d bottom wall
4 bar-shaped member
5, 10 vibrator
6 oscillating element
9a, 9b board
21 first contacting element
22 second contacting element
23 resilient element
24 first connecting element
25 second connecting element
26 opening
31 supporting element
32 first guiding member
33 second guiding member
34 fastening hole
81, 82 needle-shaped member
83 spring member
91 holder hole
201 circuit board
202 fixing member
203 test object
321, 331 guiding groove
$L_1$, $L_2$ characteristic curve
$P_1$ initial contacting point
$P_2$ final contacting point
$\Delta_1$ offset
$\delta_1$, h projected length

BEST MODE(S) FOR CARRYING OUT THE INVENTION

Best modes for carrying out the present invention (hereinafter, "embodiments") are described below with reference to the attached drawings. It should be noted that the drawings are just schematic representations, and that the relation between the thickness and width of each element, or a thickness ratio of each element may be different from those actually measured. Moreover, it should be obvious that the relationship or ratio of dimensions may be different in each of the drawings.

First Embodiment

Figure 2:
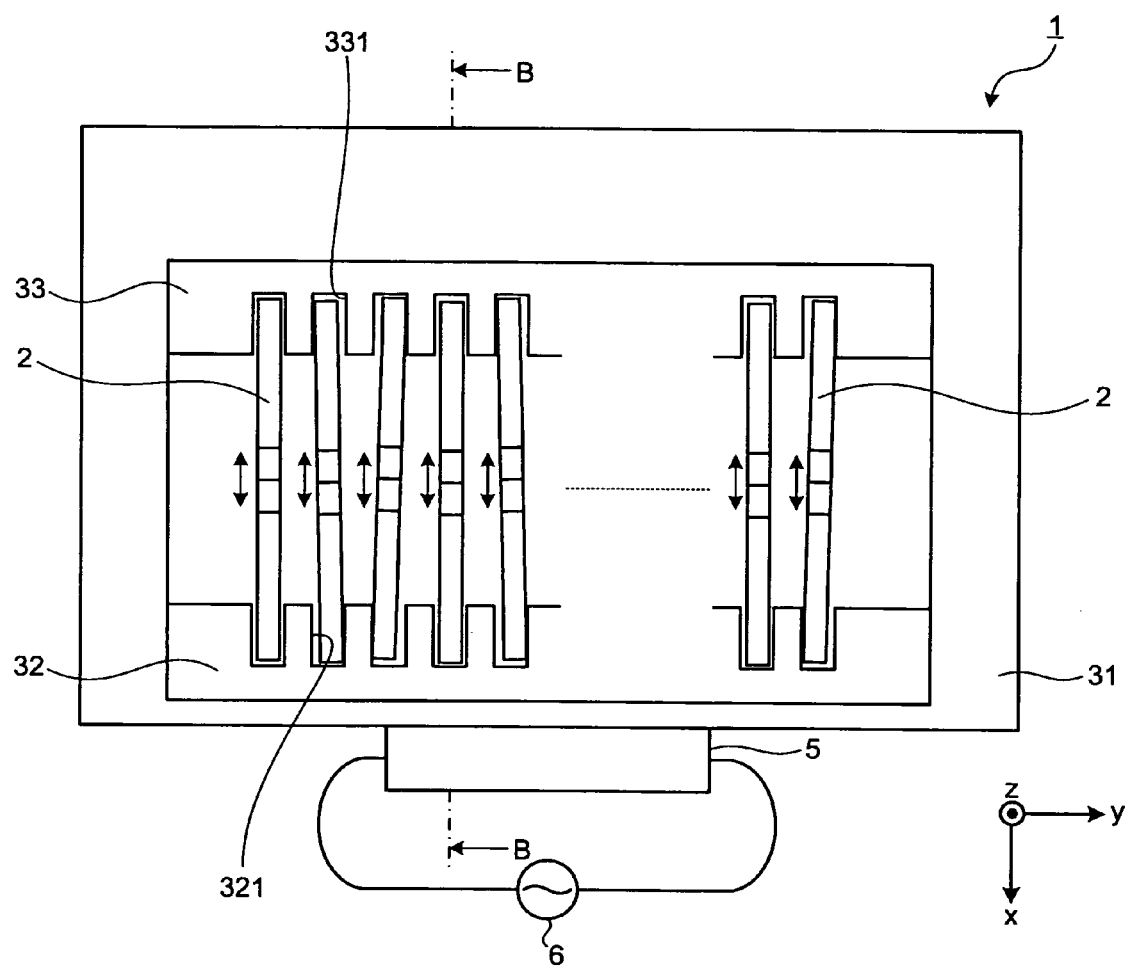
FIG. 2 is a view in a direction indicated by an arrow A shown in FIG. 1.

FIG. 1 is a perspective view of a structure of a conductive contact unit according to a first embodiment of the present invention. FIG. 2 is a view in a direction indicated by an arrow A shown in FIG. 1. A conductive contact unit 1, shown in FIGS. 1 and 2, is used for testing the conductive state or operating characteristics of testing a circuitry, such as a liquid crystal panel that is a test object. The conductive contact unit 1 includes a plurality of conductive contacts 2 each having a plate-like shape, a conductive contact holder 3 that accommodates and holds the conductive contacts 2, a bar-shaped member 4 that is fastened to the conductive contact holder 3 and supports the conductive contacts 2, a vibrator 5 (vibration applying unit) that is attached to a side wall 3c of the conductive contact holder 3 and applies vibration to the conductive contact holder 3, and an oscillating element 6 that generates a signal having a predetermined frequency for causing vibration of the vibrator 5.

Figure 3:
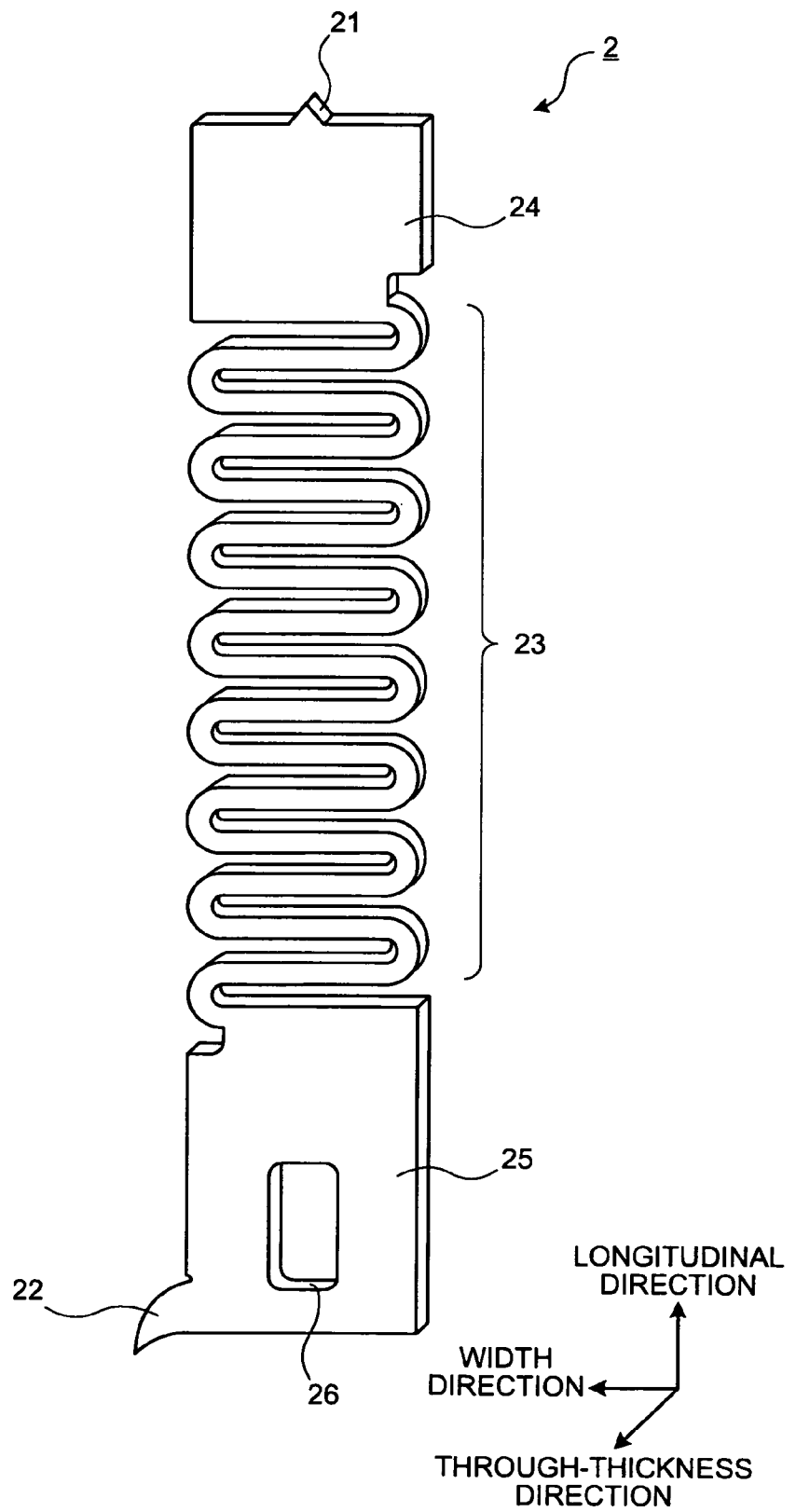
FIG. 3 is a diagram of a structure of a conductive contact.

The conductive contact 2 is described in detail below. FIG. 3 is a diagram of a structure of the conductive contact 2. In the following description, the vertical direction in FIG. 3 is hereinafter referred to as a "longitudinal direction of the conductive contact 2", the horizontal direction in FIG. 3 is hereinafter referred to as a "width direction of the conductive contact 2", and the direction perpendicular to the longitudinal direction and the width direction is hereinafter referred to as a "through-thickness (thickness) direction of the conductive contact 2", respectively.

The conductive contact 2 shown in FIG. 3 establishes an electrical connection between different circuitries. The conductive contact 2 includes: a first contacting element 21 that is brought into physical contact with a predetermined circuitry (specifically, a flexible board to be supplied a test signal); a second contacting element 22 that is brought into physical contact with a circuitry other than that brought into contact with the first contacting element 21 (specifically, a test object such as a liquid crystal display); an resilient element 23 that is interposed between the first contacting element 21 and the second contacting element 22, and is extensible in the longitudinal direction; a first connecting element 24 having the same width and thickness as the resilient element 23, and connecting the first contacting element 21 and the resilient element 23; and a second connecting element 25 having the same width and thickness as the resilient element 23, connecting the second contacting element 22 and the resilient element 23, and having an opening 26 penetrating therethrough in the through-thickness direction. The second contacting element 22 further projects from a width-direction edge of the second connecting element 25 in the width direction.

The conductive contact 2 is formed using a conductive material. Specifically, the conductive contact 2 is formed by etching, for example, nickel (Ni) based thin foil. The first connecting element 24 and the second connecting element 25 may be different in width and/or thickness from the resilient element 23.

The conductive contact holder 3 is described below. The conductive contact holder 3 includes: a supporting element 31 having an approximately cubic shape with a hollow portion; a first guiding member 32 and a second guiding member 33, attached to the hollow portion of the supporting element 31 to face each other, for guiding a plurality of conductive contacts; and fastening holes 34, formed at predetermined positions on respective side walls 3b facing each other with the supporting element 31 in between, for fastening ends of the bar-shaped member 4.

Figure 4:
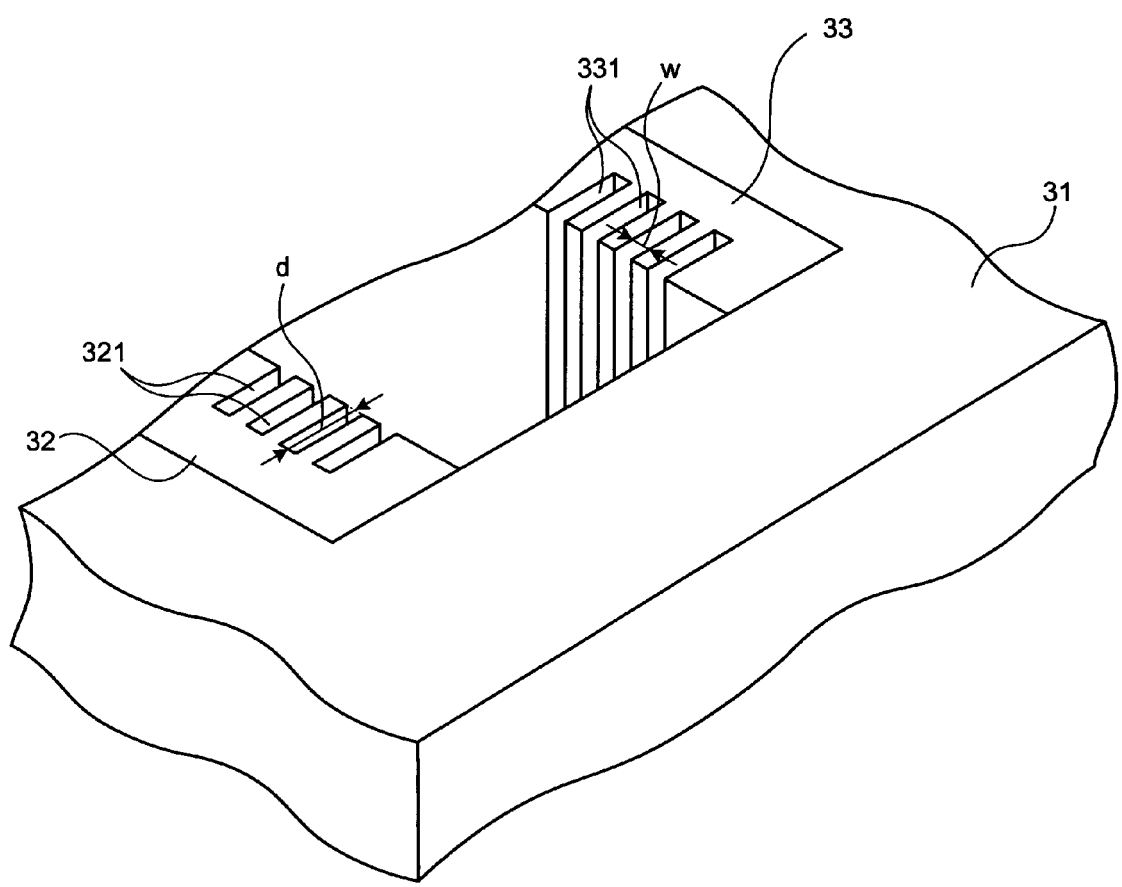
FIG. 4 is a partial enlarged perspective view of an upper wall of a conductive contact holder.

FIG. 4 is a partial enlarged perspective view of an upper wall 3a of the conductive contact holder 3. As shown in FIG. 4, the first guiding member 32 includes a plurality of linear guiding grooves 321 that engage and hold one edges in the width direction of the conductive contacts 2 in a slidable manner when the conductive contacts 2 are mounted. The second guiding member 33 includes a plurality of linear guiding grooves 331 (second guiding grooves) that are positioned facing the guiding grooves 321 (first guiding grooves) of the first guiding member 32, and engage and hold the other edges of the conductive contacts 2 that are embedded in the width direction in the guiding grooves 321 in a slidable manner. The guiding grooves 321 and the guiding grooves 331 that are formed in pairs, function to align the conductive contacts 2 in a planar direction intersecting perpendicularly with the longitudinal direction, and to guide the extending action of the conductive contacts 2. The adjacent pairs of the guiding grooves 321 and the guiding grooves 331 have the same intervals, and are positioned in parallel to each other.

Each of the guiding grooves 321 and the guiding grooves 331 has the same groove width (denoted as "w"), and the same groove depth (denoted as "d"). The groove depth is sufficient if the conductive contact 2 is held firmly without becoming loose. Therefore, in this sense, the groove depth of the guiding groove 321 may be different from that of the guiding groove 331.

The groove depth (w) of each guiding groove is slightly larger than the thickness of the conductive contact 2. Further, a distance between groove bottoms of the facing guiding grooves 321 and 331 is slightly larger than the width of the conductive contact 2. In this way, clearance is present between the conductive contact 2 and the conductive contact holder 3, allowing the conductive contact 2 to move freely, not being restricted in the guides.

Figure 5:
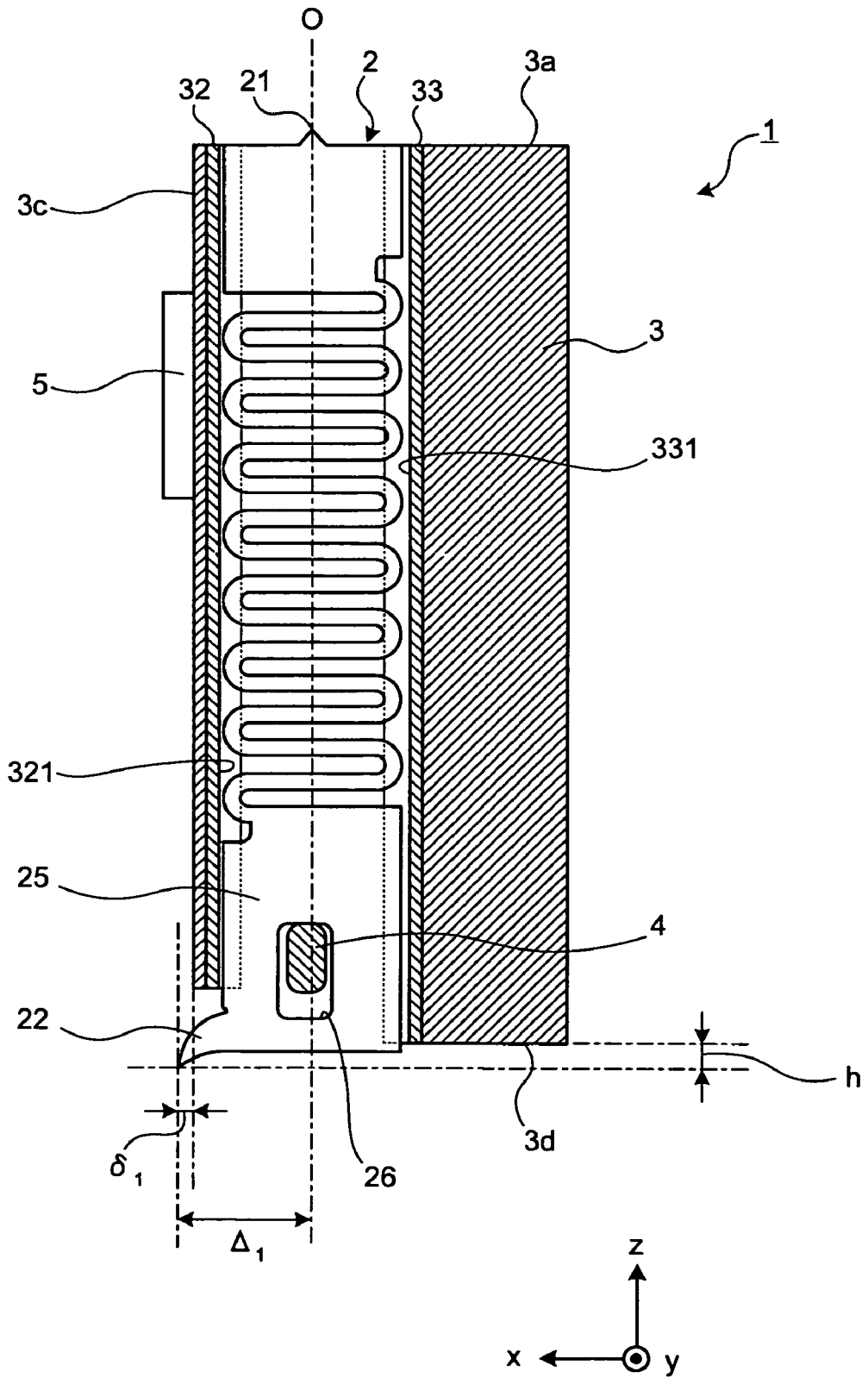
FIG. 5 is a diagram of an internal structure of the conductive contact unit according to the first embodiment.

The conductive contact holder 3 is further described regarding its structure. FIG. 5 is a diagram of an internal structure of the conductive contact unit 1. The first guiding member 32 and the second guiding member 33 extend along a z axis direction (a direction perpendicular to the groove width direction and the groove depth direction), shown in FIG. 5, in parallel with each other. The guiding groove 321 extends along the z axis direction shown in FIG. 5 for a length shorter than that the guiding groove 331 extends along the same z axis direction. The guiding groove 331 reaches a bottom wall 3d of the conductive contact holder 3, while the guiding groove 321 only extends up to a position above the bottom wall 3d in the vertical direction.

In the conductive contact holder 3 having the above structure, a tip of the second contacting element 22 projects by a predetermined amount from the side wall 3c of the conductive contact holder 3 in the x axis direction (the projected length is denoted as "$\delta_1$") in a state applying no load to the first contacting element 21 and the second contacting element 22 (the state shown in FIG. 5). The projected length $\delta_1$ is determined based on conditions such as a size of the conductive contact 2 or the conductive contact holder 3, or the load that should be added to the test object.

In this way, by arranging the second contacting element 22 to project from the side wall 3c of the conductive contact holder 3 in the width direction, an operator can easily make an observation visually or with a microscopic from the top of the conductive contact unit during actual testing, and perform testing operations while checking physical contact between the tip of the conductive contact and the test object. Accordingly, the operator no longer needs to bend over to observe the contact between the conductive contact and the test object. This makes it possible to further improve testing workability and reliability, and reduce the operator's burden.

The tip of the second contacting element 22 projects by a predetermined amount from the bottom wall 3d in a negative direction in the z axis (the projected length is denoted as "h"). Further, the second contacting element 22 is provided at a position offset by a predetermined distance (the offset is denoted as "$\Delta_1$") from a symmetric axis O that is in parallel with the longitudinal direction of the resilient element 23 or the first connecting element 24. The projected length h and the offset $\Delta_1$, as well as the projected length $\delta_1$, are determined based on conditions such as a size of the conductive contact 2 or the conductive contact holder 3, or the load that should be added to the test object.

In the conductive contact holder 3, at least the first guiding member 32 and the second guiding member 33 that are brought into direct contact with the conductive contacts 2, are preferably formed using insulating material to prevent a short circuit. For example, the conductive contact holder 3 may be formed using a synthetic resin of low thermal expansion, and the guiding grooves 321 and the guiding grooves 331 may be formed thereon by dicing and the like. Alternatively, a base material for the conductive contact holder 3 may be formed using a ceramic such as alumina ($Al_2O_3$), zirconia ($ZrO_2$), or silica ($SiO_2$), a thermosetting resin such as a silicone, or an epoxy, an engineering plastic such as a polycarbonate or the like, and the guiding grooves 321 and the guiding grooves 331 may be formed with a processing technology such as etching.

Alternatively, instead of using an insulating material for forming the conductive contact holder 3, other appropriate materials (regardless of the insulating property of the material) also can be used to form the base material and to apply an appropriate insulating coating over the areas that could possibly contact with the conductive contacts 2 (the area including the guiding grooves 321 or the guiding grooves 331).

Both ends of the bar-shaped member 4 are inserted through the opening 26 of each of the conductive contacts 2 held between the first guiding member 32 and the second guiding member 33, then inserted into the fastening holes 34, and fixed onto the conductive contact holder 3. The bar-shaped member 4 functions to prevent the conductive contacts 2 from being disengaged from the supporting element 31, by penetrating through all of the openings 26 of the conductive contacts 2 that are held in the supporting element 31, as well as to give an initial flexure to the conductive contacts 2.

A cross section of the bar-shaped member 4, sectioned perpendicular to the longitudinal direction, has a rectangular shape with chamfered corners, and the area thereof is smaller than that of the opening 26 of the conductive contact 2. Such a cross-sectional shape enables a process, performed for forming the fastening holes 34 with respect to the conductive contacts 2, to be simplified. The above-described cross-sectional shape also enables the conductive contacts 2 to move smoothly when a load is applied to the conductive contacts 2, and ensures stability in supporting the bar-shaped member 4 when a predetermined load is applied to the conductive contacts 2. Moreover, when the test object is brought into contact with the conductive contacts 2, the opening 26 becomes separated from the bar-shaped member 4, enabling the opening 26 to move freely with respect to the bar-shaped member 4. As a result, the conductive contacts 2 can be rotated slightly, as described later.

The cross-sectional shape of the bar-shaped member 4, sectioned perpendicular to the longitudinal direction, is not limited to the above, and may be polygonal, square, or circular, for example. It should be needless to say that the shape of the fastening hole 34 varies according to the cross-sectional shape of the bar-shaped member 4.

The bar-shaped member 4 having the above structure is also formed using an insulating material. Because this bar-shaped member 4 penetrates through the openings 26 of a number of the conductive contacts 2 to support all of the conductive contacts 2, the bar-shaped member 4 is preferably made of an insulating material such as a ceramic, with high rigidity, and with small flexure generated upon application of a load.

For the vibrator 5, for example, a piezoelectric element or the like may be used. Alternatively, an element with an attached balancer that gives an unbalanced load relative to a rotation motor may be used. The vibrator 5 vibrates in response to a signal having a predetermined frequency from the oscillating element 6, to apply vibration to the first guiding member 32 and the second guiding member 33. Although the vibrator 5 is attached to the side wall 3c, an attachment position of the vibrator 5 is not limited to this example, as long as it can apply vibration to the first guiding member 32 and the second guiding member 33.

The vibrator 5 more preferably has a vibrational frequency that is approximately the same as a resonance frequency of the supporting element 31 constituting the conductive contact holder 3, as a resonance frequency of the first guiding member 32 or the second guiding member 33, or as a resonance frequency of the conductive contacts 2. This is because electrodes to be applied to the vibrator 5 can be reduced to provide efficient vibration.

Further, the vibrator 5 need not be attached to the conductive contact holder 3, as long as it is positioned near the conductive contact holder 3 and is able to cause vibration of the conductive contact holder 3. For example, the bar-shaped member penetrating through the conductive contacts 2 may serve as a vibrator.

Figure 6:
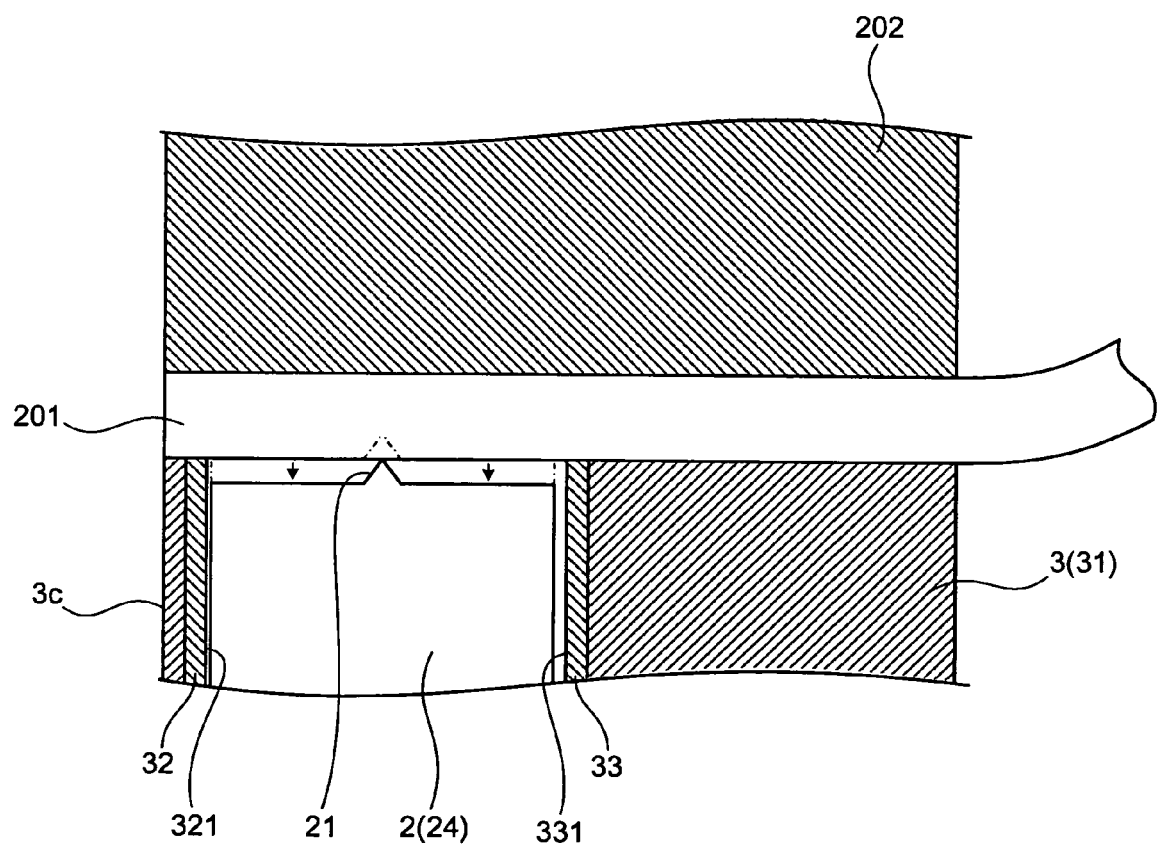
FIG. 6 is a partial enlarged view of an upper portion of the conductive contact holder attached with a circuit board that is connected to a test circuit.

FIG. 6 is a partial enlarged view of the upper portion of the conductive contact holder 3 attached with a circuit board for establishing an electrical connection with a signal processing circuit that generates and outputs a test signal. For the purpose of comparison, the position of the conductive contact 2 shown in FIG. 5 is indicated with a dotted line. A circuit board 201 shown in FIG. 6 has a plurality of wires and connecting electrodes, made of a material such as nickel, formed on one surface of the sheet-like board made of a material such as polyimide. FIG. 6 illustrates an arrangement where the electrodes of the circuit board 200 are aligned to be brought into contact with the first contacting elements 21 of the conductive contacts 2, and the circuit board 201 is held between the a fixing member 202, made of the same material as the conductive contact holder 3, and the conductive contact holder 3. To fix the circuit board 201 onto the conductive contact unit 1, the conductive contact holder 3 and the fixing member 202 may be fixed together with screws (not shown), for example. If the arrangement transits from the state shown in FIG. 5 to that shown in FIG. 6, a load (initial load), other than the gravity, acting upon the conductive contacts 2, is applied to each of the conductive contacts 2, shrinking each of the resilient elements 23 in the longitudinal direction.

The other end of the circuit board 201 is connected to the signal processing circuit (not shown) as described above, and transmits and receives an electrical signal to and from the test object that is in contact with the second contacting elements 22. In FIG. 6, the circuit board 201 is brought into contact with the conductive contacts 2. Instead, another configuration is possible where, for example, connecting terminals of a signal outputting circuit are directly brought into contact with the conductive contacts 2.

In a known conductive contact unit, a plate-like covering member has been used for applying the initial load to the conductive contacts. However, when such a covering member is used, the contacting element located at the tip of the conductive contact needed to be projected further by a distance equal to the thickness of the covering member. Thus, it has been a problem that a greater area becomes unstable when the load is applied, and the area near the tip could become bent easily. Because the conductive contact unit 1 according to the first embodiment does not use the covering member, the problem is no longer occurring, and the size of the first contacting element 21 can be dramatically reduced in comparison with the known example.

Figures 1, 7:
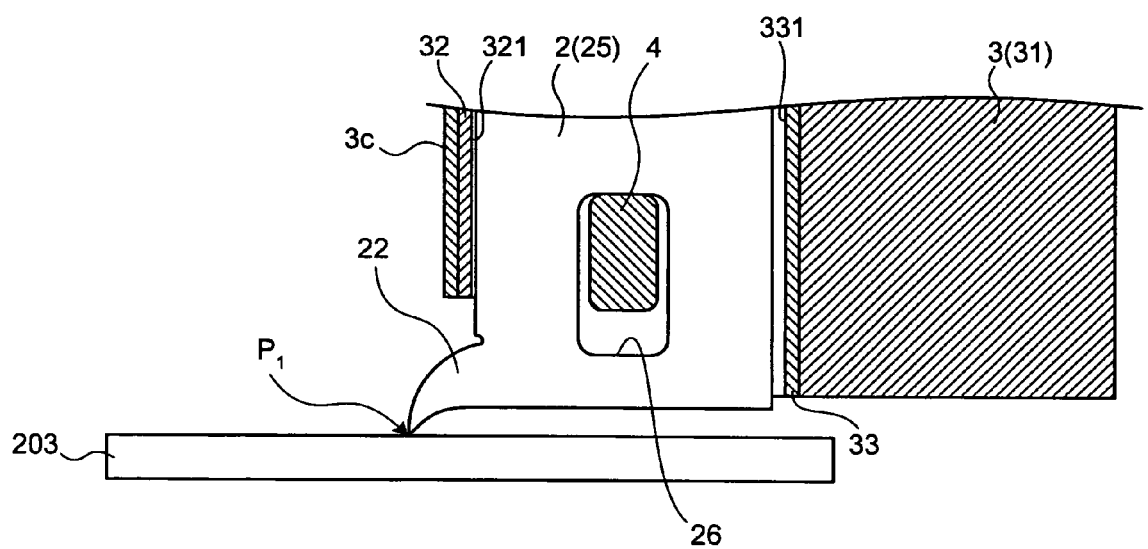
Figures 2, 7:
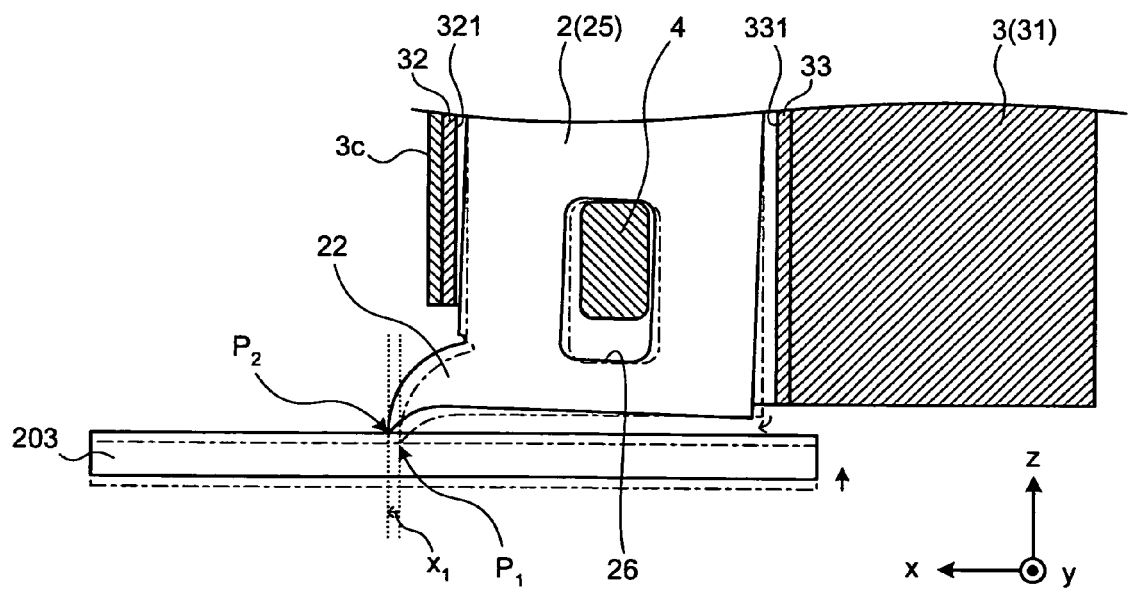

Described below is an illustrative embodiment of a contact between conductive contact unit 1 and the test object. FIG. 7-1 is a diagram of an area near the bottom end of the conductive contact 2 immediately after a test object 203 is brought into contact with the second contacting elements 22 of the conductive contacts 2. FIG. 7-2 is a diagram of the area near the bottom end of the conductive contact 2 when the test object 203 is elevated to a test position. In FIG. 7-2, the position of the conductive contact 2 immediately after the contact is established is shown in dotted line for the purpose of comparison.

The tip of the second contacting element 22 is offset by $\Delta_1$ from the longitudinal symmetric axis (central axis) O of the resilient element 23 or the first connecting element 24, as described above with reference to FIG. 5. Therefore, the line of action of the load acting upon the tip of the second contacting element 22 that is brought into contact with the test object 203 does not go through the center of gravity of the conductive contact 2. Thus, a moment is generated in the conductive contact 2. As a result, the resilient element 23 shrinks and the opening 26 is moved away from the bar-shaped member 4. Due to this moment, the conductive contact 2 rotates slightly, while the conductive contact 2 goes through the transition from the state shown in FIG. 7-1 to that shown in FIG. 7-2. This rotation is generated because a small gap is present between the edge of the resilient element 23 and the guiding groove 321, and the other edge thereof and the guiding groove 331, respectively, in the width direction.

Due to this rotation, the second contacting element 22 slightly rotates clockwise in FIG. 7-2, and moves along the surface of the test object 203 while keeping in contact with the test object 203. More specifically, the tip of the second contacting element 22 slides from an initial contact point $P_1$ to a final contacting point $P_2$, scratching the surface of the test object 203, to move in the x axis direction by a distance of $x_1$ (>0). In this manner, while the tip of the second contacting element 22 is moved on the surface of the test object 203, the oxidized film or dust accumulated to the surface thereof is removed, ensuring a stable electrical contact between the second contacting elements 22 and the test object 203. This is advantageous because, if the movement speed (elevating speed) of the test object 203 is controlled appropriately at this time, not only the surface of the test object 203 can be protected from being damaged greatly by the tips of the second contacting elements 22, but also the conductive contacts 2 can be prevented from being applied with an excessive load.

In the state shown in FIG. 7-2, the vibration of the vibrator 5 is transmitted to the conductive contacts 2, causing the conductive contacts 2 to slightly vibrate. Thus, it is expected that further effects of scratching can be made on an oxide layer on a pad of the test object 203 while the contact is being made.

In the conductive contact unit 1, vibration of the vibrator 5 causes the first guiding member 32 and the second guiding member 33 to slightly vibrate. Therefore, even when brought into contact with the guiding grooves 321 and 331, the conductive contacts 2 can be detached therefrom immediately. This makes an apparent kinetic coefficient of friction small, thus making the frictional force small. Because the width-direction edges of the conductive contacts 2 are in contact with the guiding grooves 321 and 331 for a reduced time, it becomes possible to reduce the friction generated between the guiding grooves 321 and 331.

The conductive contact unit 1 holds the conductive contacts 2 by engaging parts of the conductive contacts 2 into the guiding grooves 321 and the guiding grooves 331 laid in the direction that the resilient element 23 of the conductive contacts 2 is extensible. Therefore, a problem of buckling or twisting due to the shrinkage of the resilient element 23, which is a problem unique to the plate-like conductive contact 2, can be prevented from occurring. Furthermore, the spring characteristic of the resilient element 23 can be prevented from deteriorating due to the problem such as above. In this manner, a large stroke can be achieved without causing buckling or twisting, even when a certain or more load within an appropriate range is applied to the conductive contact 2, and a desirable contact can be obtained between the second contacting elements 22 and the test object 203.

Moreover, in the conductive contact unit 1, the conductive contacts 2 are held by the guiding grooves 321 and the guiding grooves 331. Therefore, it is possible to reduce a sliding resistance by reducing the area of the conductive contact 2 being in contact with the conductive contact holder 3, enabling the conductive contacts 2 to be extended smoothly.

Furthermore, in the conductive contact unit 1, it is sufficient if the groove width (w) of the guiding grooves 321 and the guiding grooves 331 is approximately the same as the thickness of the conductive contacts 2. Moreover, each of the intervals between the adjacent guiding grooves 321 or the adjacent guiding grooves 331 can be reduced to a given small value, as long as the insulation between the adjacent conductive contacts 2 is ensured. Therefore, it is possible to reduce the arrangement intervals between the conductive contacts 2, and to support the small arrangement intervals between the connecting electrodes or terminals of the contacted circuitries.

In addition, in the conductive contact unit 1, the bar-shaped member 4 penetrates to give the initial flexure onto the conductive contacts 2, as well as to prevent the conductive contacts 2 from being disengaged. As a result, it is possible to reduce the distance h of the tip of the second contacting element 22, that is, the lower end of the conductive contact 2 projecting in the vertical direction below the bottom wall $3d$ of the conductive contact holder 3. In other words, the size of the second contacting element 22 can be reduced, and the tip of the conductive contact 2 can be prevented from being bent, and the conductive contact 2 can be supported in a stable manner. Thus, the conductive contacts 2 can be prevented from being disengaged from the guiding grooves 321 and/or the guiding grooves 331 near the bottom area thereof. As a result, positional accuracy of the tip of conductive contacts 2 can be improved, and reliability and durability of the conductive contact unit 1 can be also improved.

Figure 8:
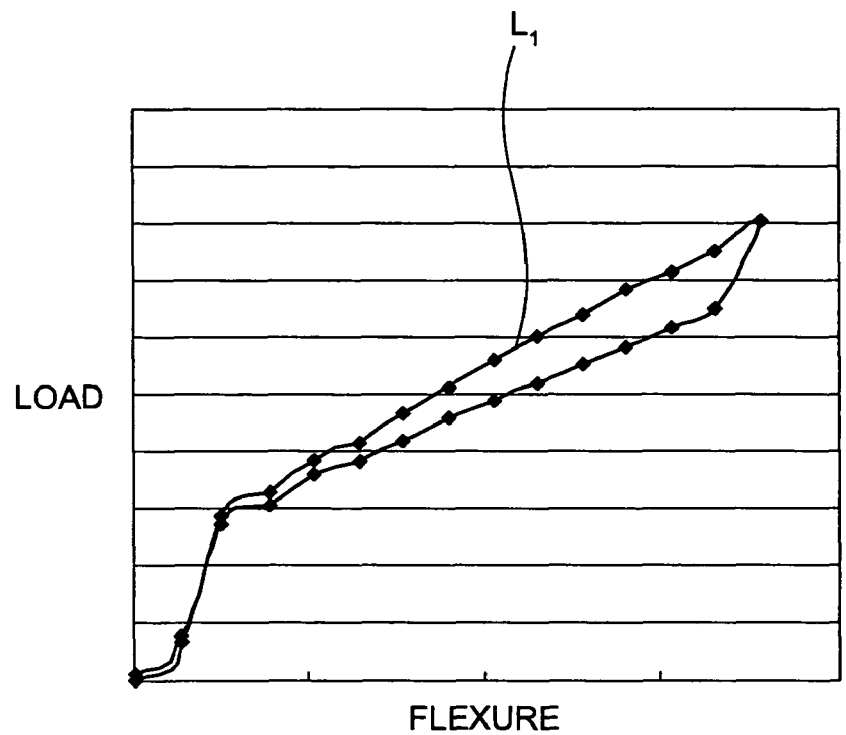
FIG. 8 is a chart of flexure-load characteristics (upon application of vibration) of the conductive contacts in the conductive contact unit according to the first embodiment of the present invention.
Figure 9:
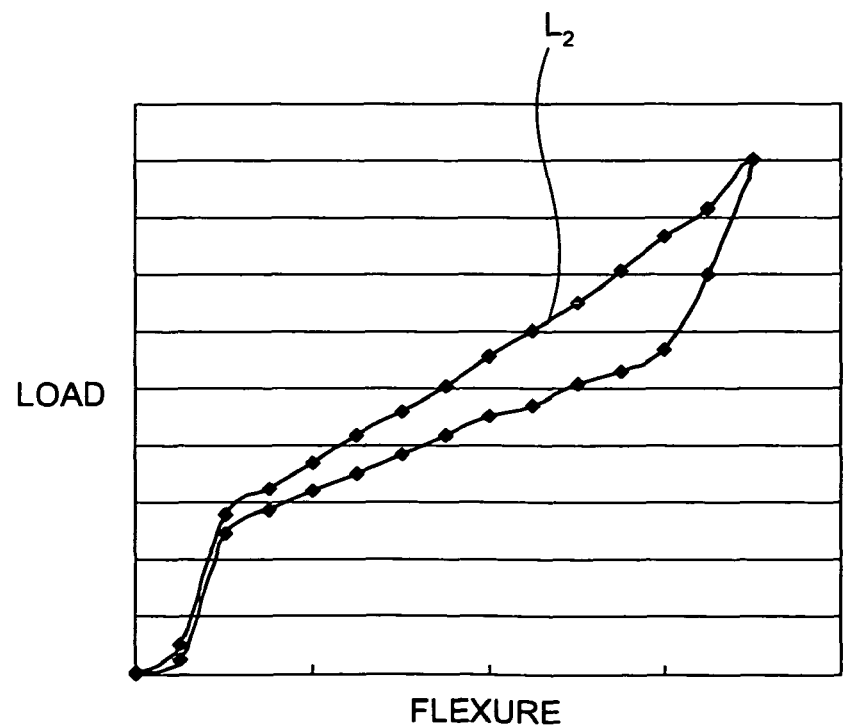
FIG. 9 is a chart of flexure-load characteristics (upon application of no vibration) of the conductive contacts in the conductive contact unit according to the first embodiment of the present invention.

FIG. 8 depicts a relationship between flexure and load (flexure-load characteristics) of the conductive contacts 2 when the vibrator 5 is vibrating in the conductive contact unit 1, and FIG. 9 depicts flexure-load characteristics when the vibrator 5 is not vibrating. In FIGS. 8 and 9, indicated by the upper lines are characteristics in the compressed state, and the lower lines are characteristics in the elongated state.

In comparison between characteristic curves $L_1$ shown in FIG. 8 and characteristic curves $L_2$ shown in FIG. 9, the difference in characteristics (hysteresis) between the compressed state and the elongated state of the conductive contact 2 is smaller when the vibrator 5 is vibrating. Further, in comparison of differences between a load generated in the compressed state of the conductive contact 2 and a load generated in the elongated state of the conductive contact 2 with the same amount of flexure, the difference is smaller in FIG. 8 than in FIG. 9 by about 30%. This tendency is true regardless of the frequency of a signal oscillated by the oscillating element 6.

As described above, in the conductive contact unit 1 according to the first embodiment, vibration of the conductive contacts 2 inside the conductive contact holder 3 reduces the frictional force between the guiding grooves 321 and 331. This makes less variation in loads generated in the conductive contacts 2 than in those of conventional technologies, so that a stable test signal can be supplied to the test object 203. Such an advantage is increased by realizing narrower pitch of the test object 203.

According to the first embodiment of the present invention, a conductive contact unit includes a plurality of conductive contacts for inputting and outputting an electrical signal to and from a circuitry to establish an electrical connection between different circuitries, and includes a conductive contact holder that accommodates and holds the conductive contacts, and a vibration applying unit that applies vibration to the conductive contact holder. Accordingly, a variation in frictional force generated between the conductive contacts and the guides is reduced, so that a test signal can be supplied stably.

The shape of the second contacting element of the conductive contact should be decided depending on various conditions, such as the material used for the conductive contacts, the shape of the conductive contact holder that accommodates and holds the conductive contacts, the load that should be applied to the conductive contact holder, and a type of the test object. The detailed shape of the second contacting element may be modified appropriately as long as it has the technical characteristics of the present invention.

Second Embodiment

Figure 10:
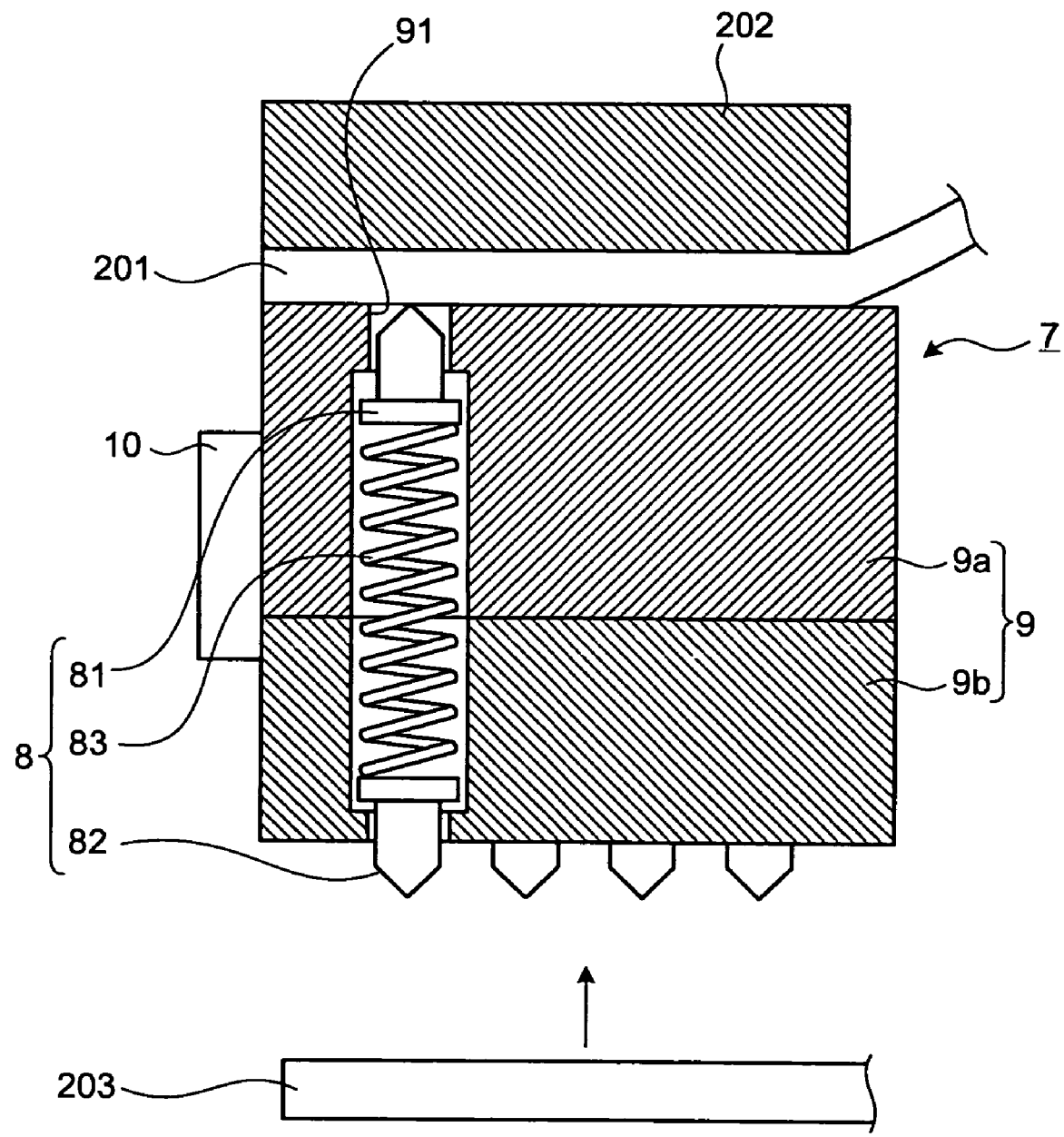
FIG. 10 is a diagram of an internal structure of a conductive contact unit according to the second embodiment.

FIG. 10 is a partial cross-sectional view of a structure of a conductive contact unit according to a second embodiment of the present invention. A conductive contact unit 7 shown in FIG. 10 includes a plurality of conductive contacts 8, a conductive contact holder 9 that holds the conductive contacts 8, and a vibrator 10 attached to the conductive contact holder 9. The vibrator 10 is connected to an oscillating element (not shown), and vibrates in response to a signal having a predetermined frequency output from the oscillating element.

In FIG. 10, constituting elements with the same reference numerals as those of the first embodiment have the same structures as those of the first embodiment, unless otherwise specified.

Each of the conductive contacts 8 is a pin-type probe, and includes a needle-shaped member 81 (a first needle-shaped member) that is brought into contact with a circuit board 201, a needle-shaped member 82 (a second needle-shaped member) that is brought into contact with a connecting terminal (not shown) on the test object 203, and a spring member 83 that is interposed between the needle-shaped members 81 and 82 and is extensible to couple the both needle-shaped members. The needle-shaped members 81 and 82 and the spring member 83, which constitute each conductive contact 8, are configured coaxially using conductive material, and, as a whole, penetrate through each holder hole 91 formed in the conductive contact holder 9.

The conductive contact holder 9 is formed of two stacked layers including boards 9a and 9b. The holder hole 91 has, around its edges, stepped shapes corresponding to flange shapes of the needle-shaped members 81 and 82, and functions to prevent the conductive contact 8 from being disengaged from the conductive contact holder 9.

According to the second embodiment of the present invention, the same effect can be achieved as in the first embodiment.

Other Embodiments

The first and the second embodiments are described above in detail as best mode for carrying out the present invention. However, the present invention is not intended to be limited only to these two embodiments. For example, in the first embodiment, the first guiding member and/or the second guiding member may be configured of a material such as a ceramic, so that the guiding member(s) can serve as a vibrator(s) to apply vibration directly.

Moreover, in addition to the test of the liquid crystal panel, the conductive contact unit according to embodiments of the present invention can also be applied to a test of a package board mounted with a semiconductor chip, or a high density probe unit used for performing a wafer-level test.

As described above, the present invention may include various embodiments that are not described herein, and is susceptible to various design changes or modifications and the like within the scope of the technological concept defined by the claims.

INDUSTRIAL APPLICABILITY

The conductive contact unit according to embodiments of the present invention are useful for testing the conducting state and operating characteristics of an electronic component such as a liquid crystal panel or a semiconductor integrated circuit.

The invention claimed is:

1. A conductive contact unit that establishes an electrical connection between different circuitries, and includes a plurality of conductive contacts for receiving and outputting an electrical signal from and to the circuitries, the conductive contact unit comprising:
   a conductive contact holder that accommodates and holds the conductive contacts, each of the conductive contacts having a plate-like shape and one edge and the other edge in a width direction thereof, the conductive contact holder having first guiding grooves and second guiding grooves that are opposedly arranged in the conductive contact holder and slidably and tiltably guide the one edges and the other edges of the conductive contacts; and
   a vibration applying unit that applies vibration to the conductive contact holder.

2. The conductive contact unit according to claim 1, wherein the vibration applying unit includes a vibrator attached to a side surface of the conductive contact holder.

3. The conductive contact unit according to claim 1, wherein the vibration applying unit applies vibration with a resonance frequency of the conductive contact holder or vibration with a resonance frequency of the conductive contacts to the conductive contact holder.

4. The conductive contact unit according to claim 3, wherein the vibration applying unit includes a vibrator attached to a side surface of the conductive contact holder.

5. The conductive contact unit according to claim 1, wherein
   each of the conductive contacts includes
   a first contacting element that is brought into physical contact with one of the different circuitries;
   a second contacting element that is brought into physical contact with one of the different circuitries other than the one the first contacting element is brought into contact with;
   a resilient element that is interposed between the first contacting element and the second contacting element, and is expandable and contractible in a longitudinal direction;
   a first connecting element that connects the resilient element and the first contacting element; and
   a second connecting element that connects the resilient element and the second contacting element.

6. The conductive contact unit according to claim 5, wherein at least a portion of the second contacting element projects from an external surface of the conductive contact holder, inside which guiding grooves are formed, in a normal direction of the external surface.

* * * * *